United States Patent
Malladi et al.

(10) Patent No.: US 10,545,860 B2
(45) Date of Patent: Jan. 28, 2020

(54) INTELLIGENT HIGH BANDWIDTH MEMORY APPLIANCE

(71) Applicant: Samsung Electronics Co., Ltd., Suwon-si, Gyeonggi-do (KR)

(72) Inventors: Krishna T. Malladi, San Jose, CA (US); Hongzhong Zheng, Los Gatos, CA (US); Robert Brennan, Santa Clara, CA (US); Hyungseuk Kim, Hwaseong-si (KR); Jinhyun Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 67 days.

(21) Appl. No.: 15/796,743

(22) Filed: Oct. 27, 2017

(65) Prior Publication Data
US 2019/0050325 A1    Feb. 14, 2019

Related U.S. Application Data

(60) Provisional application No. 62/543,918, filed on Aug. 10, 2017.

(51) Int. Cl.
*G06F 12/02* (2006.01)
*G06F 12/0862* (2016.01)
*G06F 9/30* (2018.01)

(52) U.S. Cl.
CPC ........ *G06F 12/023* (2013.01); *G06F 12/0862* (2013.01); *G06F 9/3001* (2013.01); *G06F 2212/602* (2013.01)

(58) Field of Classification Search
CPC ... G06F 12/023; G06F 12/0862; G06F 9/3001
See application file for complete search history.

(56) References Cited

U.S. PATENT DOCUMENTS

| 9,344,091 B2 | 5/2016 | Jayasena et al. |
| 2011/0231739 A1* | 9/2011 | Kim ............... G06F 11/1048 714/773 |

(Continued)

OTHER PUBLICATIONS

Matthew Lambert. An Overview of High-Bandwidth Memory. May 19, 2015. Available at: https://bit-tech.net/reviews/tech/memory/an-overview-of-high-bandwidth-memory-hbm/1/ (Year: 2015).*

(Continued)

*Primary Examiner* — Ryan Bertram
(74) *Attorney, Agent, or Firm* — Renaissance IP Law Group LLP

(57) ABSTRACT

Inventive aspects include An HBM+ system, comprising a host including at least one of a CPU, a GPU, an ASIC, or an FPGA; and an HBM+ stack including a plurality of HBM modules arranged one atop another, and a logic die disposed beneath the plurality of HBM modules. The logic die is configured to offload processing operations from the host. A system architecture is disclosed that provides specific compute capabilities in the logic die of high bandwidth memory along with the supporting hardware and software architectures, logic die microarchitecture, and memory interface signaling options. Various new methods are provided for using in-memory processing abilities of the logic die beneath an HBM memory stack. In addition, various new signaling protocols are disclosed to use an HBM interface. The logic die microarchitecture and supporting system framework are also described.

23 Claims, 5 Drawing Sheets

(56) References Cited

U.S. PATENT DOCUMENTS

| | | | | |
|---|---|---|---|---|
| 2013/0073755 | A1* | 3/2013 | Sadowski | G06F 13/4221 |
| | | | | 710/105 |
| 2013/0292840 | A1* | 11/2013 | Shoemaker | H01L 27/108 |
| | | | | 257/773 |
| 2014/0040532 | A1* | 2/2014 | Watanabe | G06F 13/1668 |
| | | | | 711/103 |
| 2015/0155876 | A1* | 6/2015 | Jayasena | H03K 19/1776 |
| | | | | 326/39 |
| 2015/0199126 | A1* | 7/2015 | Jayasena | G11C 11/005 |
| | | | | 711/103 |
| 2018/0210830 | A1* | 7/2018 | Malladi | G06F 12/0866 |
| 2018/0365192 | A1* | 12/2018 | Saito | G06F 15/803 |

OTHER PUBLICATIONS

Ahn, Junwhan et al., "A Scalable Processing-in-Memory Accelerator for Parallel Graph Processing," ISCA' 15, Jun. 13-17, 2015, Portland, OR, USA, pp. 105-117.

* cited by examiner

INTELLIGENT HIGH BANDWIDTH MEMORY APPLIANCE

BACKGROUND

The present disclosure relates to semiconductor circuits, and more particularly, to an intelligent high bandwidth memory appliance including a logic die for offloading complex logic operations traditionally performed by a host.

The Internet has caused a huge expansion in the number of computer servers that serve data to millions of computers and mobile devices. Artificial Intelligence (AI) and other deep learning applications are becoming more common and are presently in high demand. Today's server computer environment is moving toward in-storage and in-memory computation, so that some computation is performed closer to where the data actually resides. This increases performance and reduces energy consumption.

Emerging applications like deep neural networks need massive computational and memory abilities to train on different datasets and learn with high accuracy. Moreover, as applications like high performance computers (HPC), graphics algorithms, and the like, become data and compute intensive, energy-efficiency and low latency become critical.

Recently, High Bandwidth Memory (HBM) and High Bandwidth Memory 2 (HBM2) have been used to achieve higher bandwidth while using less power in a smaller form factor by stacking Dynamic Random Access Memory (DRAM) dies one atop another, and provide an asynchronous communication interface with a host. The asynchronous nature of the communications increase performance but also makes it more difficult to process complex logic operations. When logic operations are complex, there is less determinism. In other words, it is less certain how long a particular complex logic operation will take to complete.

SUMMARY

An HBM+ system is disclosed, comprising a host including at least one of a central processing unit (CPU), a graphics processing unit (GPU), an application specific integrated circuit (ASIC), or a field programmable gate array (FPGA); and an HBM+ stack including a plurality of high bandwidth memory (HBM) modules arranged one atop another, and a logic die disposed beneath the plurality of HBM modules. The logic die is configured to offload processing operations from the host.

In some embodiments, the logic die comprises a host manager including an interface PHY and a host queue manager, wherein the host manager is configured to interface with a host via the interface PHY, and to queue communications received from the host. The logic die may further include a memory controller including a prefetch engine and a cache controller, wherein the memory controller is configured to interface with a memory via the prefetch engine and the cache controller. The logic die may further include a High Bandwidth Memory (HBM) controller including a memory controller configured to interface with a stack of HBM modules. The logic die may further include an offload processing logic section configured to offload processing operations from the host.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Figure 1:
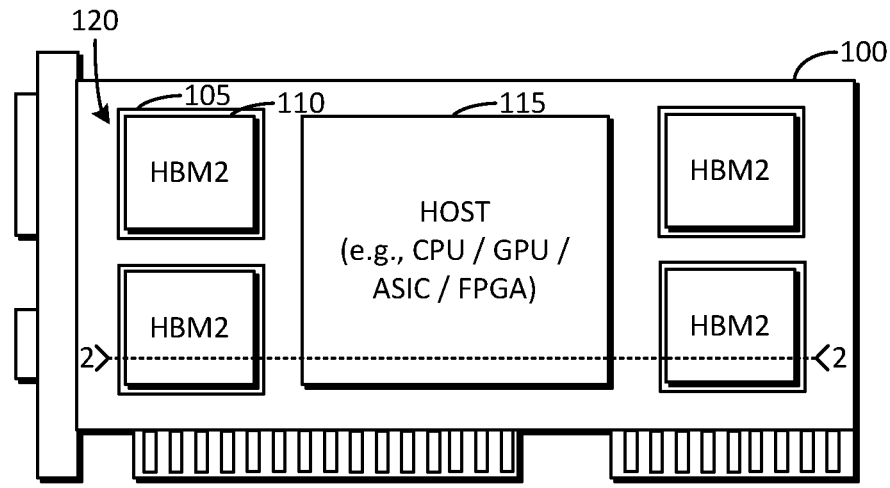
FIG. 1 is an example plan view block diagram of an HBM+ unit.

Reference will now be made in detail to various embodiments, examples of which are illustrated in the accompanying drawings. In the following detailed description, numerous specific details are set forth to enable a thorough understanding of the embodiments. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the embodiments.

The terminology used in the description of the embodiments herein is for the purpose of describing particular embodiments only and is not intended to be limiting of the inventive concept. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

With the growth artificial intelligence (AI) computing applications, new hardware is required to enable new applications in domains spanning image and speech classification, media analytics, healthcare, autonomous machines, and smart assistants. AI applications drive machine learning frameworks. In deep neural network algorithms, for example, frequently the size of the data set outgrows the computational abilities of the hardware available. New high performance computers (HPCs) with many teraflops of computing performance abilities have emerged as the stand-in solution until newer architectures are available. HBM evolved to HBM2 and provides high bandwidth for parallel accelerators, where four to eight stacks of modules per host unit. A host may include, for example, a central processing unit (CPU) such as a microprocessor, an application specific integrated circuit (ASIC), a graphics processing unit (GPU), a field-programmable gate array (FPGA), or the like. Current bandwidths are in the one terabyte per second range, which is twice as efficient as double data rate type five synchronous graphics RAM (GDDR5).

Embodiments disclosed herein include a system architecture that provides specific compute capabilities in a logic die of high bandwidth memory along with the supporting hardware and software architectures, logic die microarchitecture, and memory interface signaling options. Various new methods are provided for using in-memory processing abilities of the logic die beneath an HBM memory stack. In addition, various new signaling protocols are disclosed to use an HBM interface. The logic die microarchitecture and supporting system framework are also described.

The system provides an end-end solution for performing energy efficient and high-speed computation on accelerators such as GPUs, FPGAs, etc. Offloading processing operations introduces an additional level of complexity in either the hardware or software tool chain to extract the benefits. A new architecture, herein referred to as "HBM+", builds off of HBM2 and PIM. The HBM2 architecture includes up to four stacks per host, up to eight channels per stack, with four to eight dies per stack. There may be eight to 16 banks per channel, and bank groups are supported. The data line (DQ) width is 128, plus an optional error code correcting (ECC) pin, plus two pseudo channels, for example. With two gigabytes per second per minute, the system bandwidth is one terabyte per second per system.

FIG. 1 is an example plan view block diagram of an HBM+ unit 100. The HBM+ unit 100 can include a host 115 (e.g., CPU, GPU, ASIC, FPGA, etc). The HBM+ unit 100 can include multiple HBM+ stacks 120 of HBM2 modules 110 and a corresponding logic die 105 disposed beneath the HBM2 modules 110. The HBM+ unit 100 can be a PCI-E compatible board.

Figure 2:
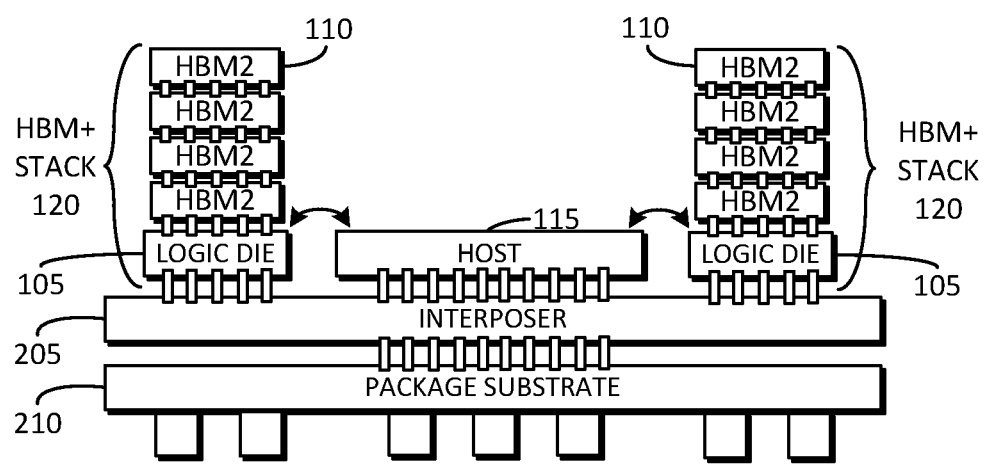
FIG. 2 illustrates a side elevation view block diagram of the HBM+ unit of FIG. 1 taken along line 2-2.

FIG. 2 illustrates a side elevation view block diagram of the HBM+ unit 100 of FIG. 1 taken along line 2-2. As shown in FIG. 2, the HBM2 modules are stacked on the logic die 105, forming an HBM+ stack 120. Multiple HBM+ stacks 120 may be included on the HBM+ unit 100. The host 115 may communicate with each of the logic dies 105. The host 115 and the logic dies 105 may be disposed atop and coupled to an interposer 205. The interposer 205 may be disposed atop and coupled to a package substrate 210.

In HBM+, the logic die 105 may perform basic input/output (I/O) operations, leading to lower latency and better memory traffic. Machine learning algorithms benefit from this architecture, as they require intensive bandwidth for training and prediction. A processor-near-memory assists the host 115 by way of the HBM+ logic die 105.

The HBM+ stack 120 may offload computational work from the host 115 to the logic die 105 beneath the HBM2 modules 110. The host 115 may be a CPU, GPU, ASIC, FPGA, or the like. The logic die 105 then implements specialized logic functions, which may be specific to machine learning applications which have special high bandwidth requirements. Consequently, the system performance improves and the energy consumption decreases.

Figure 3:
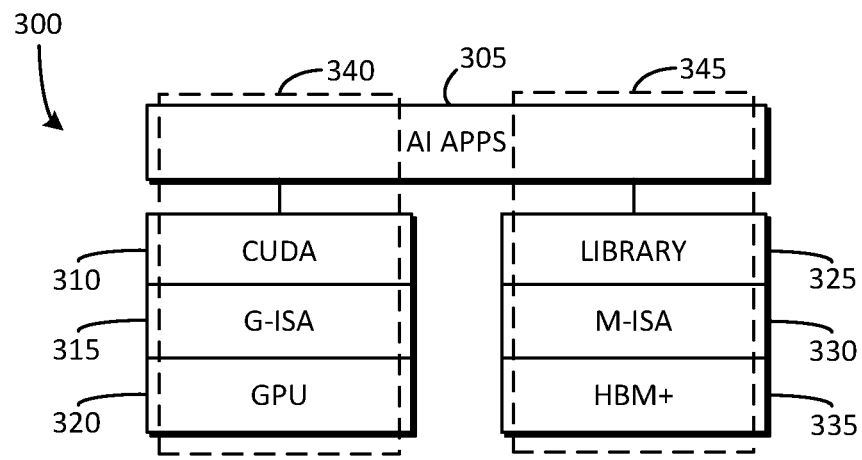
FIG. 3 illustrates a framework block diagram of two types of architectures for offloading computational work from a host.

FIG. 3 illustrates a framework block diagram 300 of two types of architectures (e.g., 340 and 345) for offloading computational work from a host (e.g., 115). As shown in FIG. 3, a first architecture 340 uses HBM compute capacities (e.g., 310, 315, and 320) without a need to modify an upper layer application (e.g., artificial intelligence (AI) apps 305). The HBM compute capacities may include compute unified device architecture (CUDA) 310, GPU instruction set architecture (GPU-ISA or G-ISA) 315, and/or GPU 320.

An alternative architecture 345 provides HBM+ library function calls (e.g., 325, 330, and 335) to the application 305 to use the underlying HBM logic instruction set architecture (ISA). The HBM+ library function calls may include a library 325, a memory ISA 330, or other HBM+ specific library function calls 335. In this embodiment, the upper layer application (e.g., artificial intelligence (AI) apps 305) is modified to make calls to the library function calls. The overall framework includes a system, microarchitecture, library, and driver. The system may also include two hardware protocols and a logic microarchitecture, as further described below.

Figure 4:
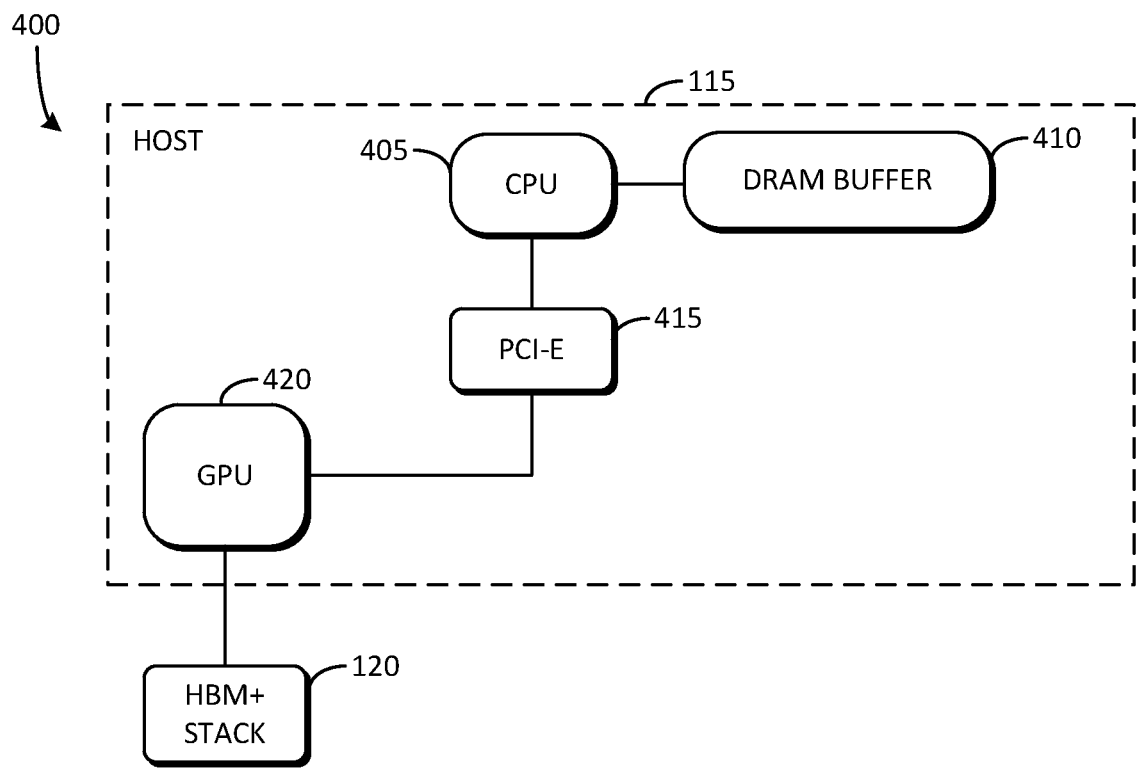
FIG. 4 illustrates an example block diagram of a system including host components and an HBM+ stack in which a primarily hardware implementation is provided in accordance with some embodiments.

FIG. 4 illustrates an example block diagram of a system 400 including host components (e.g., 405, 410, 415, and 420) and an HBM+ stack 120 in which a primarily hardware implementation is provided in accordance with some embodiments. The host 115 may include, for example, a CPU 405, a DRAM buffer 410, a PCI-E interface 415, a GPU 420, or the like. In a primarily hardware implementation, the host 115 (e.g., GPU 420) can include a memory controller change. The GPU 420 may directly offload operations to the HBM2 modules (e.g., 110), and/or to the HBM+ stack 120, which may perform offloaded logic processing. In this embodiment, there may be synchronous or asynchronous host-to-memory protocols and no application changes are required.

Figure 5A:
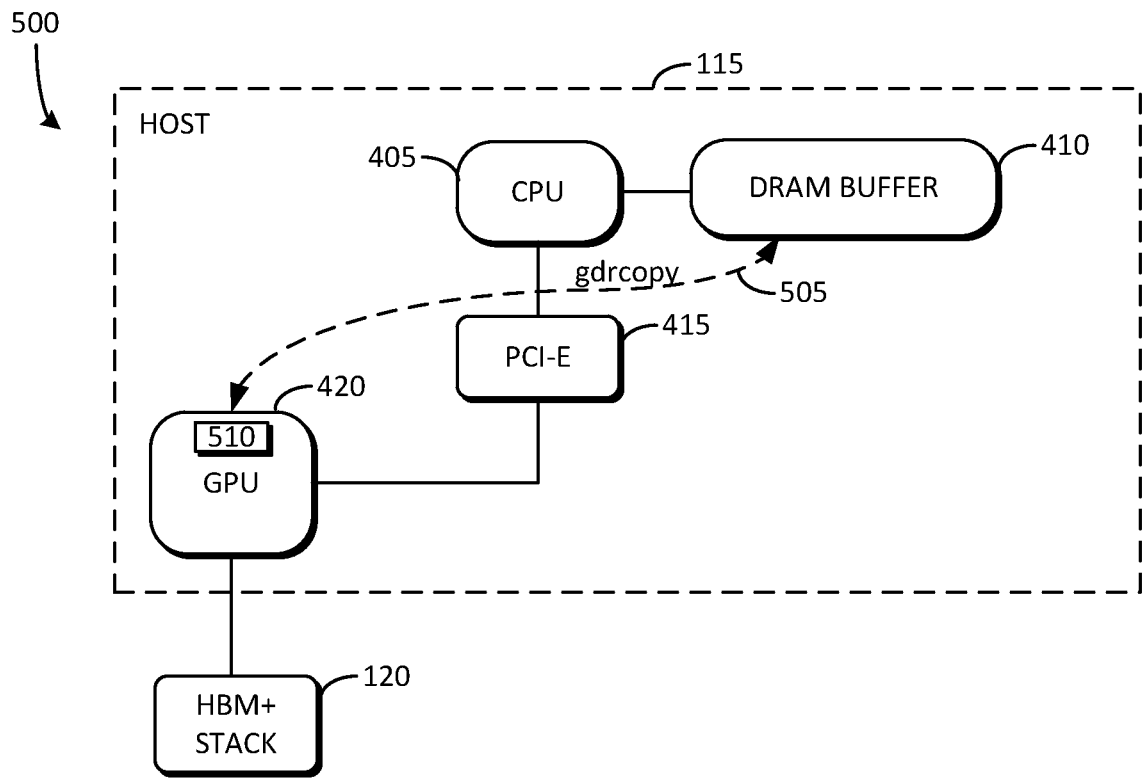
FIG. 5A illustrates an example block diagram of a system including host components and an HBM+ stack in which a primarily software implementation is provided in accordance with some embodiments.

FIG. 5A illustrates an example block diagram of a system 500 including host components (e.g., 405, 410, 415, and 420) and an HBM+ stack 120 in which a primarily software implementation is provided in accordance with some embodiments. The host 115 may include, for example, a CPU 405, a DRAM buffer 410, a PCI-E interface 415, a GPU 420, or the like.

In a primarily software implementation, a memory mapped I/O (MMIO) technique may be used, such as gdrcopy, to create un-cached user space mappings of GPU memory into the CPU 405. This user space mapping enables the CPU 405 to directly read data of offloaded kernals 510 from the GPU 420 into a common buffer within the DRAM buffer 410. Then, the CPU 405 can copy data into the HBM+ stack 120 or redirect HBM logic to relevant addresses. Upper level applications such as the AI applications 305 (of FIG. 3.) may be modified to use the HBM+ stack 120 for computations. No hardware changes are required.

Figure 5B:
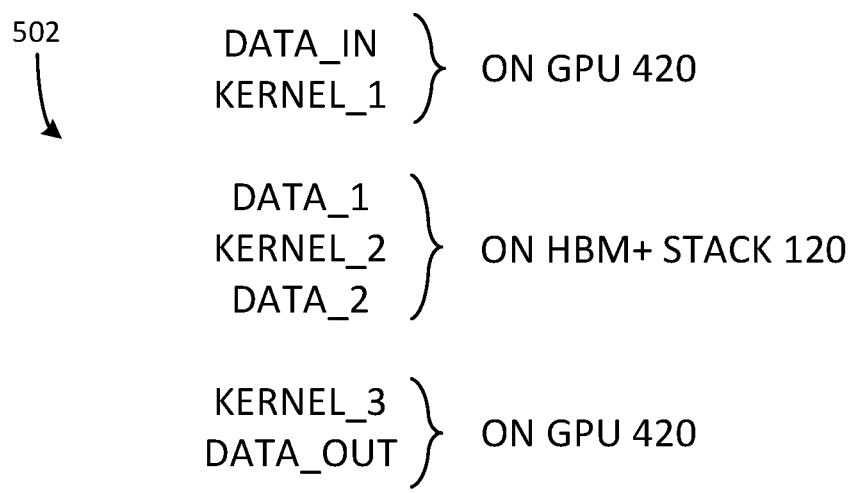
FIG. 5B illustrates a diagram that shows how different kernels can be processed on either a GPU or an HBM+ stack in accordance with some embodiments.

FIG. 5B illustrates a diagram 502 that shows how different kernels can be processed on either a GPU or an HBM+ stack in accordance with some embodiments. In other words, different portions of an application can run on different hardware depending on the configuration. Put differently, different kernels or functions may be initiated and processed on either the GPU 420 or the HBM+ stack 120, thereby distributing the processing load. For example, the GPU 420 may receive DATA_IN and process KERNEL_1.

The HBM+ stack 120 may receive DATA_1, process KERNEL_2, and generate DATA_2. The GPU 420 may process KERNEL_3 and generate DATA_OUT. Following is pseudo code for an example implementation:

```
gdrcopy(DATA_IN, numBytes, HostToDevice)
GPU_Kernel<<<1,N>>>(DATA_IN)
CpuWaitFunction(lock)
gdrcopy(DATA_1,numBytes,DeviceToHost)
HBM_Kernel<<<1,N>>>(DATA_1)
CpuWaitFunction(lock)
gdrcopy(DATA_2, numBytes, HostToDevice)
GPU_Kernel<<<1,N>>>(DATA_2)
```

In some embodiments, one or more flags can be set to coordinate the processing between the various hardware components. For example, a first flag can be set by the CPU 405 to indicate that processing should begin. Then, the CPU 405 may copy data to the GPU 420 from the DRAM buffer 410, with at least some of the processing being handled by the HBM+ stack 120. Then, a second flag can be set by the GPU 420 and/or the HBM+ stack 120 to indicate that processing is completed. Then, the CPU 405 may copy data back over to the DRAM buffer 410.

Figure 6:
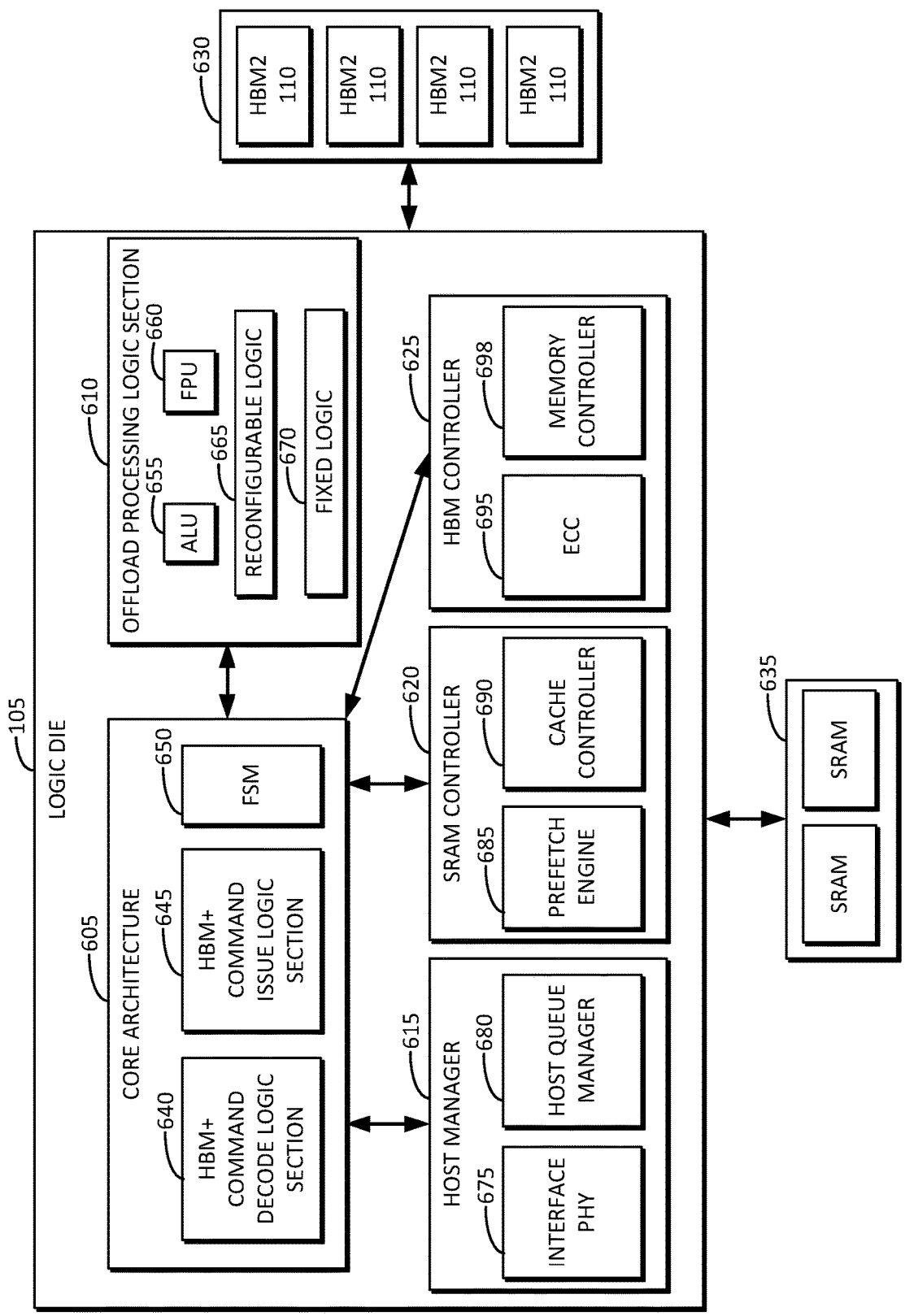
FIG. 6 illustrates a microarchitecture of the logic die of FIGS. 1 and 2.

FIG. 6 illustrates a microarchitecture of the logic die 105 of FIGS. 1 and 2. A core architecture 605 decodes processing-in-memory (PIM) commands (e.g., PIM_CMD), issues internal microoperations, and schedules multiple processing-in-memory (PIM) operations. The peripheral logic may include a host manager 615 having queuing control, an SRAM controller 620, an HBM controller 625, and an offload processing logic section 610 which may include various state machines.

More specifically, the logic die 105 may include a host manager 615 including an interface PHY 675 and a host queue manager 680. In some embodiments, the host manager 615 is configured to interface with a host (e.g., 115 of FIG. 1) via the interface PHY 675. Moreover, the host manager 615 is configured to queue communications received from the host 115. The logic die 105 may include an SRAM memory controller 620 including a prefetch engine 685 and a cache controller 690. The SRAM memory controller 620 is configured to interface with an SRAM memory 635 via the prefetch engine 685 and the cache controller 690.

The logic die 105 may include a high bandwidth memory (HBM) controller 625 including a memory controller 698 configured to interface with a stack of HBM2 modules 630, and an error correction code (ECC) logic section 695. In some embodiments, the logic die 105 may include an offload processing logic section 610 configured to offload processing operations from the host (e.g., 115 of FIG. 1). In some embodiments, the offload processing logic section 610 is configured to receive information about the offload processing operations from the host 115 via the host manager 615. In some embodiments, the offload processing logic section 610 is configured to perform the offload processing operations dependent on the received information about the offload processing operations. The received information may include a flag. The received information may include a command.

In some embodiments, a command decode logic section 640 is configured to decode the command. In some embodiments, a command issue logic section 645 is configured to issue the command. The offload processing logic section 610 may perform the offload processing operations responsive to the issued command. The offload processing logic section 610 includes at least one of an arithmetic logic unit (ALU) 655, a floating-point unit (FPU) 660, fixed logic 670, or reconfigurable logic 665. In some embodiments, the offload processing logic section 610 is configured to perform the offload processing operations dependent on data stored in the stack of HBM modules 630. In addition, the core architecture 605 can include a finite state machine 650.

Hardware based protocols can include a one-step protocol or a two-step protocol. The one-step protocol is suited for simple operations where the host (e.g., 115 of FIG. 1) need not wait for a computational result before proceeding with additional operations. In other words, there is deterministic timing between the host 115 and the HBM+ stack (e.g., 120 of FIG. 1). In the one-step protocol, the HBM memory controller 698 may lock only source and destination addresses and/or banks. An example of a one-step protocol includes atomic operations such as a read-modify-write operation.

The two-step protocol is suited for operations where the host 115 waits for a computational result. An example includes a transactional command. In this embodiment, the PHY is modified (e.g., a pin is changed or added) with repurposed transaction pins to obtain information flow between the host 115 and the HBM+ stack 120 (of FIG. 1). In this embodiment, the HBM memory controller 698 may lock the entire stack of HBM2 modules 630 during a transaction. An example includes transposing a 100 by 100 matrix.

Various categories (i.e., #s 1 through 5) of function libraries capable of being executed on the logic die (e.g., 105 of FIG. 1) are show below in Table 1. The function libraries may be coordinated with the host (e.g., 115 of FIG. 1), each with discrete operational fields and constituent functions. These function libraries are compatible with both synchronous and asynchronous HBM+ interfaces. Performance is increased by way of lower bus transactions, queuing, and memory controller latencies. Fixed logic and/or reconfigurable logic can be used to execute the functions.

TABLE 1

| # | Category | Function examples | Operation fields | Use cases |
|---|---|---|---|---|
| 1. | Data atomicity | Read-modify-write; test & set; compare-and-swap (CAS); increment | Identifier (ID); address; conditional operation; value | Higher ML thread parallelism |
| 2. | Data copying | Mem-copy; Mem-set | ID; source; destination addresses; range; value | Initialization; low latency data movement |
| 3. | Data reshaping | Transpose; pack/unpack (e.g., vectors); swap (e.g., elements in a matrix) | ID; source; destination addresses; reshaping operation; data stride; num | Convolutional neural network (CNN); linear algebra |
| 4. | Data reduction | Popcount (e.g., count items in a vector); accumulation (e.g.,addition); bitwise operations (e.g., bitwise AND, OR, etc); sum; min; dot-product; Euclidean distance | ID; source; destination addresses; operation; data stride; num | Convolutional neural network (CNN); binary neural network (BNN); counters |

TABLE 1-continued

| # | Category | Function examples | Operation fields | Use cases |
|---|---|---|---|---|
| 5. | Special functions | Map function; hash; pattern match; reconfigurable compute blocks | ID; source; destination addresses; operation; data stride; num | Function mappers |

A system architecture is disclosed herein including an HBM-based logic module microarchitecture, an application library kernel driver, and the related framework. The system may provide processing abilities using discrete function categories for high-bandwidth memory devices. The system may use a primarily hardware-based approach with modifications to a host memory controller to identify regions of HBM computation, and to process them on an HBM+ microarchitecture. The system may use a primarily software-based approach with MMIO to access HBM memory space directly from a CPU in order to assist task partitioning without requiring GPU support. The system may use a one-step protocol and/or a two-step protocol to enable synchronous and asynchronous HBM memory interfaces, respectively. The HBM logic disclosed herein may implement a microarchitecture to assist commands decoding, parallel function scheduling, host, and also peripheral logic to manage host-side interface, queuing, internal SRAM caching, and/or error-correction.

Figure 7:
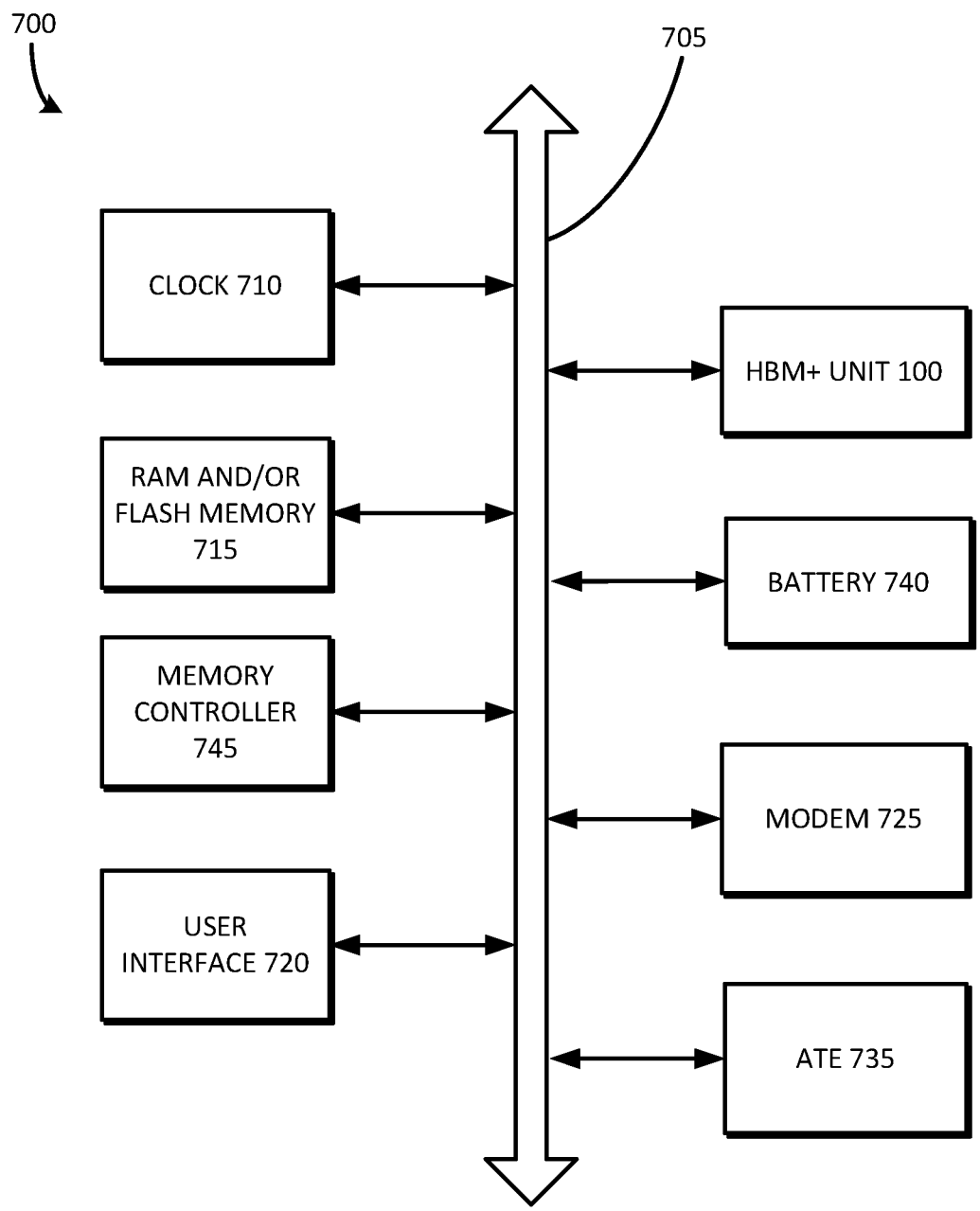
FIG. 7 is an example block diagram of a computing system including the HBM+ unit of FIG. 1 according to embodiments disclosed herein.

FIG. 7 is an example block diagram of a computing system 700 including the HBM+ unit 100 of FIG. 1 according to embodiments as disclosed herein. The HBM+ unit 100 may be electrically connected to a system bus 705. The computing system 700 may also include a clock 710, a random access memory (RAM) and/or flash memory 715, a memory controller 745, a user interface 720, a modem 725 such as a baseband chipset, and/or automated test equipment (ATE) 735, any or all of which may be electrically coupled to the system bus 705.

If the computing system 700 is a mobile device, it may further include a battery 740, which powers the computing system 700. Although not shown in FIG. 7, the computing system 700 may further include an application chipset, a camera image processor (CIS), a mobile DRAM, and the like. The memory controller 745 and the flash memory 715 may constitute a solid state drive/disk (SSD), which uses a nonvolatile memory to store data.

In example embodiments, the computing system 700 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or nonvolatile memory, e.g., RAM, ROM, etc., or in other storage devices and their associated storage media, including harddrives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. An HBM+ system, comprising:
a host including at least one of a central processing unit (CPU), a graphics processing unit (GPU), an application specific integrated circuit (ASIC), or a field programmable gate array (FPGA); and
an HBM+ stack including a plurality of high bandwidth memory (HBM) modules arranged one atop another, and a logic die disposed beneath the plurality of HBM modules;
wherein the logic die comprises:
an HBM controller including a memory controller configured to interface with the plurality of HBM modules; and
an offload processing logic section configured to offload processing operations from the host, and
wherein:
the offload processing logic section is configured to receive a first flag set by the host to indicate that the offload processing operations should begin;
the offload processing logic section is configured to perform the offload processing operations using the HBM controller responsive to the first flag; and
the HBM controller is configured to set a second flag to indicate that the offload processing operations are complete.

2. The HBM+ system of claim 1, wherein the logic die is configured to offload processing operations from the host.

3. The HBM+ system of claim 1, further comprising an interposer coupled to the host and to the logic die.

4. The HBM+ system of claim 3, further comprising a substrate coupled to the interposer.

5. The HBM+ system of claim 4, wherein the plurality of HBM modules are communicatively coupled to the logic die, and the logic die is communicatively coupled to the host.

6. The HBM+ system of claim 1, wherein:
the HBM+ stack is referred to as a first HBM+ stack;
the plurality of HBM modules is referred to as a first plurality of HBM modules;
the logic die is referred to as a first logic die; and
the system further includes a second HBM+ stack including a second plurality of HBM modules arranged one atop another, and a second logic die disposed beneath the second plurality of HBM modules.

7. The HBM+ system of claim 6, wherein:
the first and second logic dies are each configured to offload processing operations from the host;
the first plurality of HBM modules are communicatively coupled to the first logic die, and the first logic die is communicatively coupled to the host;
the second plurality of HBM modules are communicatively coupled to the second logic die, and the second logic die is communicatively coupled to the host; and
the system further comprises an interposer coupled to the host and to the first and second logic dies, and a substrate coupled to the interposer.

8. The HBM+ system of claim 1, further comprising:
a memory;
wherein the logic die comprises:
a host manager including an interface PHY and a host queue manager, wherein the host manager is configured to interface with the host via the interface PHY, and to queue communications received from the host; and
a memory controller including a prefetch engine and a cache controller, wherein the memory controller is configured to interface with the memory via the prefetch engine and the cache controller.

9. The HBM+ system of claim 8, wherein:
the offload processing logic section is configured to receive information about the offload processing operations from the host via the host manager; and
the offload processing logic section is configured to perform the offload processing operations dependent on the received information about the offload processing operations.

10. The HBM+ system of claim 9, wherein the received information includes a command.

11. The HBM+ system of claim 10, further comprising:
a command decode logic section configured to decode the command received from the host.

12. The HBM+ system of claim 11, wherein the offload processing logic section is configured to perform the offload processing operations responsive to the issued command.

13. The HBM+ system of claim 8, wherein the offload processing logic section includes at least one of an arithmetic logic unit (ALU), a floating-point unit (FPU), fixed logic, or reconfigurable logic.

14. The HBM+ system of claim 8, wherein the offload processing logic section is configured to perform the offload processing operations dependent on data stored in the plurality of HBM modules.

15. The HBM+ system of claim 8, wherein:
the memory controller is an SRAM memory controller; and
the memory is an SRAM memory.

16. A logic die, comprising:
a host manager including an interface PHY and a host queue manager, wherein the host manager is configured to interface with a host via the interface PHY, and to queue communications received from the host;
a memory controller including a prefetch engine and a cache controller, wherein the memory controller is configured to interface with a memory via the prefetch engine and the cache controller;
a High Bandwidth Memory (HBM) controller including a memory controller configured to interface with a stack of HBM modules; and
an offload processing logic section configured to offload processing operations from the host,
wherein:
the received information includes a first flag set by the host to indicate processing should begin;

the offload processing logic section is configured to perform the processing operations using the HBM controller responsive to the first flag; and the HBM controller is configured to set a second flag to indicate that the processing operations are complete.

17. The logic die of claim 16, wherein:

the offload processing logic section is configured to receive information about the offload processing operations from the host via the host manager; and the offload processing logic section is configured to perform the offload processing operations dependent on the received information about the offload processing operations.

18. The logic die of claim 16, wherein the received information includes a command.

19. The logic die of claim 18, further comprising:

a command decode logic section configured to decode the command received from the host.

20. The logic die of claim 19, wherein the offload processing logic section is configured to perform the offload processing operations responsive to the issued command.

21. The logic die of claim 19, wherein the offload processing logic section includes at least one of an arithmetic logic unit (ALU), a floating-point unit (FPU), fixed logic, or reconfigurable logic.

22. The logic die of claim 19, wherein the offload processing logic section is configured to perform the offload processing operations dependent on data stored in the stack of HBM modules.

23. The logic die of claim 16, wherein:

the memory controller is an SRAM memory controller; and the memory is an SRAM memory.

* * * * *